United States Patent
Bazizi et al.

(10) Patent No.: US 8,853,752 B2
(45) Date of Patent: Oct. 7, 2014

(54) PERFORMANCE ENHANCEMENT IN TRANSISTORS BY PROVIDING A GRADED EMBEDDED STRAIN-INDUCING SEMICONDUCTOR REGION WITH ADAPTED ANGLES WITH RESPECT TO THE SUBSTRATE SURFACE

(71) Applicant: GLOBALFOUNDRIES Inc., Grand Cayman (KY)

(72) Inventors: El Mehdi Bazizi, Dresden (DE); Alban Zaka, Dresden (DE); Gabriela Dilliway, Dresden (DE); Bo Bai, Radebeul (DE)

(73) Assignee: GLOBALFOUNDRIES Inc., Grand Cayman (KY)

( * ) Notice: Subject to any disclaimer, the term of this patent is extended or adjusted under 35 U.S.C. 154(b) by 0 days.

(21) Appl. No.: 13/661,188

(22) Filed: Oct. 26, 2012

(65) Prior Publication Data
US 2014/0117417 A1    May 1, 2014

(51) Int. Cl.
*H01L 29/78*    (2006.01)

(52) U.S. Cl.
USPC .......................................... 257/288; 438/299

(58) Field of Classification Search
CPC .................................................... H01L 21/8234
USPC .......................................................... 257/288
See application file for complete search history.

(56) References Cited

U.S. PATENT DOCUMENTS

2007/0235802 A1* 10/2007 Chong et al. ................... 257/346
2009/0140302 A1*  6/2009 Onoda ........................... 257/288

* cited by examiner

*Primary Examiner* — Matthew W Such
*Assistant Examiner* — Warren H Kilpatrick
(74) *Attorney, Agent, or Firm* — Amerson Law Firm, PLLC

(57) ABSTRACT

In sophisticated semiconductor devices, transistors may be formed on the basis of an efficient strain-inducing mechanism by using an embedded strain-inducing semiconductor alloy. The strain-inducing semiconductor material may be provided as a graded material with a smooth strain transfer into the neighboring channel region in order to reduce the number of lattice defects and provide enhanced strain conditions, which in turn directly translate into superior transistor performance. The superior architecture of the graded strain-inducing semiconductor material may be accomplished by selecting appropriate process parameters during the selective epitaxial growth process without contributing to additional process complexity.

24 Claims, 4 Drawing Sheets

US 8,853,752 B2

PERFORMANCE ENHANCEMENT IN TRANSISTORS BY PROVIDING A GRADED EMBEDDED STRAIN-INDUCING SEMICONDUCTOR REGION WITH ADAPTED ANGLES WITH RESPECT TO THE SUBSTRATE SURFACE

BACKGROUND OF THE INVENTION

1. Field of the Invention

Generally, the present disclosure relates to integrated circuits, and, more particularly, to transistors comprising an embedded strain-inducing semiconductor material for enhancing charge carrier mobility in a silicon-based channel region of the transistor.

2. Description of the Related Art

The fabrication of complex integrated circuits requires a large number of transistors to be formed in and on an appropriate semiconductor material. For example, several hundred million transistors and more may have to be provided in presently available complex integrated circuits, wherein performance of the transistors in the speed critical signal paths substantially determines overall performance of the integrated circuit. Generally, a plurality of process technologies are currently practiced, wherein, for complex circuitry, such as microprocessors, storage chips and the like, CMOS technology is the most promising approach due to the superior characteristics in view of operating speed and/or power consumption and/or cost efficiency. In CMOS circuits, complementary transistors, i.e., P-channel transistors and N-channel transistors, are used for forming circuit elements, such as inverters and other logic gates, to design highly complex circuit assemblies. During the fabrication of complex integrated circuits using CMOS technology, the complementary transistors, i.e., N-channel transistors and P-channel transistors, are formed on a substrate including a crystalline semiconductor layer. A MOS transistor or generally a field effect transistor, irrespective of whether an N-channel transistor or a P-channel transistor is considered, comprises so-called PN junctions that are formed by an interface positioned between highly doped drain or source regions and an inversely or weakly doped channel region disposed between the drain region and the source region.

The conductivity of the channel region, i.e., the drive current capability of the conductive channel, is controlled by a gate electrode formed in the vicinity of the channel region and separated therefrom by a thin insulating layer. The conductivity of the channel region, upon formation of a conductive channel due to the application of an appropriate control voltage to the gate electrode, depends on, among other things, the mobility of the charge carriers and, for a given extension of the channel region in the transistor width direction, the distance between the source and drain regions, which is also referred to as channel length. Thus, the reduction of the channel length, and associated therewith the reduction of the channel resistivity, has been a dominant design criterion for accomplishing an increase in the operating speed of the integrated circuits.

When reducing the channel length of field effect transistors, generally an increased degree of capacitive coupling is required in order to maintain controllability of the channel region, which may typically require an adaptation of a thickness and/or material composition of the gate dielectric material. For example, for a gate length of approximately 80 nm, a gate dielectric material based on silicon dioxide with a thickness of less than 2 nm may be required in high-speed transistor elements, which may, however, result in increased leakage currents caused by hot carrier injection and direct tunneling of charge carriers through the extremely thin gate dielectric material. Since a further reduction in thickness of silicon dioxide-based gate dielectric materials may increasingly become incompatible with thermal power requirements of sophisticated integrated circuits, in some approaches, the inferior controllability of the channel region of the short channel transistors caused by the continuous reduction of the critical dimensions of gate electrode structures has been addressed by an appropriate adaptation of the material composition of the gate dielectric material.

To this end, it has been proposed that, for a physically appropriate thickness of a gate dielectric material, i.e., for a thickness resulting in an acceptable level of gate leakage currents, a desired high capacitive coupling may be achieved by using appropriate material systems, which have a significantly higher dielectric constant compared to the conventionally used silicon dioxide-based materials. For example, dielectric materials including hafnium, zirconium, aluminum and the like may have a significantly higher dielectric constant and are, therefore, referred to as high-k dielectric materials, which are to be understood as materials having a dielectric constant of 10.0 or higher when measured in accordance with typical measurement techniques.

Although basically the above-identified approach is considered a very promising strategy for enhancing performance of sophisticated transistors, it turns out that the presence of the high-k dielectric material in the vicinity of the channel region may result in a pronounced degradation of charge carrier mobility, thereby at least partly offsetting the advantages gained by the increased capacitive coupling obtained by the high-k dielectric material.

It is well known that, in view of enhancing overall performance of sophisticated transistors, also various strain engineering techniques are typically applied, since creating a specific type of strain in the channel region of silicon-based transistors may result in a significant increase of the charge carrier mobility, which in turn translates into superior current drive capability and thus switching speed. A plurality of strategies have thus been developed. For instance, providing highly stressed layers above the completed transistor structures, providing strain-inducing sidewall spacer structures, embedding strain-inducing semiconductor alloys, such as silicon/germanium, silicon/carbon and the like, into drain and source areas of the transistors represent frequently used process strategies, while, in other approaches, in addition to or alternatively, also globally strained semiconductor base materials may be used.

In particular, the incorporation of a strain-inducing silicon/germanium material into the active regions of P-channel transistors is a very efficient strain-inducing mechanism, as will be described in more detail with reference to FIG. 1.

FIG. 1 schematically illustrates a cross-sectional view of a semiconductor device 100 in a manufacturing stage in which a plurality of gate electrode structures 160A, 160B, 160C are formed on an active region 102A, in and above which a plurality of P-channel transistors 150A, 150B, 150C are to be formed. The active region 102A is to be understood as a part of a silicon-based semiconductor layer 102, which in turn is formed above an appropriate substrate 101, such as a silicon substrate and the like. The semiconductor layer 102, which is initially provided in the form of a continuous semiconductor material, is appropriately laterally divided into a plurality of active regions by appropriate isolation structures (not shown), such as shallow trench isolations. As discussed above, the transistors 150A, 150B, 150C may represent highly complex semiconductor devices in which superior performance and reduced lateral dimensions are required so that the gate electrode structures 160A, 160B, 160C may be provided with a gate length of 40 nm and less, depending on the overall process and device requirements. It should be appreciated that the gate length is to be understood, according to the sectional view of FIG. 1, as the horizontal extension of a gate electrode material 163 formed on a gate dielectric material 161, which separates the electrode material 163 from a channel region 151, which in turn laterally connects to drain and source regions 152. Furthermore, the gate electrode structures 160A, 160B, 160C typically comprise a spacer structure 165. As explained above, the gate dielectric material 161 may comprise a high-k dielectric material, for instance in the form of hafnium oxide and the like, possibly in combination with a conventional silicon oxide material, silicon oxynitride material and the like, while, in other cases, a conventional silicon oxide-based dielectric material may be used as the gate dielectric layer 161. As discussed above, when a high-k dielectric material is incorporated in the layer 161, generally reduced charge carrier mobility may be induced in the channel region 151, which in turn is to be compensated for or even overcompensated by providing an additional strain-inducing mechanism.

Hence, the device 100 comprises an efficient strain-inducing mechanism on the basis of a silicon/germanium alloy 104 that is provided in respective cavities 103, which are formed in the active region 102A laterally adjacent to the respective gate electrode structures 160A, 160B, 160C. The strain-inducing effect of the silicon/germanium material 104 results from a lattice mismatch of the natural lattice constant of the silicon/germanium material compared to the silicon base material of the active region 102A. That is, upon forming the cubic face-centered crystalline structure, the germanium atomic species having a greater covalent radius compared to a silicon atom results in a greater lattice constant when the crystalline growth occurs in a non-disturbed manner. When forming the silicon/germanium crystal lattice on a silicon base material, which, thus, has a reduced lattice constant compared to the silicon/germanium alloy, the growing silicon/germanium material takes on the lattice constant of the underlying base material, thereby resulting in a deformed or strained crystalline material, which in turn may interact with the neighboring channel region 151, thereby inducing a desired compressive strain therein. Basically, the resulting strain may significantly depend on the magnitude of the lattice mismatch between the material 104 and the silicon base material of the active region 102A, wherein the actual strain in the channel region 151 is also significantly determined by the amount of strained silicon/germanium material, i.e., by the depth and shape of the cavity 103 and by the proximity of the cavity and, thus, the material 104 with respect to the channel region 151. Generally, it would, therefore, be preferable to provide the material 104 with reduced offset from the channel region 151 and with a high germanium concentration in order to increase the lattice mismatch and thus the resulting degree of lattice deformation and strain. It turns out, however, that simply increasing the germanium concentration does not necessarily result in superior transistor performance since many other aspects may also significantly contribute to the finally obtained transistor characteristics.

For example, lattice defects may occur, in particular, at the interface between the silicon base material and the strained semiconductor material 104, wherein the defect density may significantly increase with an increasing germanium concentration in the material 104. Furthermore, during the further processing, a pronounced difference in processing silicon material compared to the processing of a silicon/germanium material having a high germanium concentration may also contribute to process non-uniformities, for instance when forming a metal silicide in the drain and source regions 151, which may thus also negatively affect the final transistor characteristics.

For this reason, frequently, a "graded" germanium concentration may be used in the material 104, for instance by providing a deeper portion 104A with a moderately high germanium concentration, for instance up to 30 atomic percent or higher, while an upper portion 104B may have a significantly lower germanium concentration, for instance 20 atomic percent or less. In this manner, many disadvantages associated with a high germanium concentration at a top surface of the device 100 may be avoided or at least significantly reduced by providing the graded configuration of the silicon/germanium alloy 104.

Generally, the device 100 may be fabricated on the basis of any appropriate process strategy. For example, the active region 102A may be formed by appropriately dimensioning and forming isolation structures, which in turn is typically accomplished by applying sophisticated lithography, etch, deposition, anneal and planarization techniques. Thereafter, the basic electronic characteristics of the active region 102A are adjusted, for instance, by applying implantation processes and using an appropriate masking regime. Thereafter, the processing is continued by forming gate electrode structures, such as the structures 160A, 160B, 160C. To this end, appropriate materials are formed, for instance, by deposition techniques, wherein, as discussed above, a high-k dielectric material may be provided in combination with appropriate metal-containing electrode materials, such as titanium nitride and the like, in order to obtain a desired confinement of the sensitive high-k dielectric material and also provide an appropriate work function. To this end, it is frequently necessary to incorporate an additional metal species, such as aluminum and the like, into the metal-containing electrode material and/or into the dielectric layer 161, which may be accomplished by applying appropriate heat treatments and the like. A conventional silicon oxide-based gate dielectric is formed in combination with a polysilicon material, for instance if a negative influence of a high-k dielectric material on the charge carrier mobility is considered inappropriate. Thereafter, any further hard mask materials and cap materials are deposited as required. Next, complex lithography and etch techniques are applied in order to form the gate electrode structures 160A, 160B, 160C with the desired critical dimensions. Next, a liner material (not shown) is typically formed, for instance as a silicon nitride material, so as to confine any sensitive materials of the gate electrode structures on sidewalls thereof, followed by the formation of a portion of the spacer structure 165, which may, in other device areas, be used as a mask layer during a process sequence in which the cavities 103 may be selectively formed in the active region 102A, followed by the selective epitaxial deposition of the material 104. To this end, well-established process techniques are applied for forming the cavities 103, followed by a selective deposition sequence for forming the materials 104A, 104B. A selective epitaxial growth is performed in an ambient in which process parameters are selected in compliance with well-established process recipes so as to achieve the deposition of the silicon/germanium material on exposed crystalline silicon surface areas, while a pronounced material deposition on dielectric surface areas, such as any cap layers formed on the gate electrode structures (not shown), the spacer structures 165 and the isolation regions (not shown), is suppressed. The process parameters, such as the gas flow rate of a germanium-containing precursor gas, are appropriately adjusted in order to obtain a desired graded germanium concentration, as discussed above. Frequently, the cavities 103 are formed as box-like recesses in the active region 102A on the basis of anisotropic etch techniques. In this case, relatively steep sidewalls are formed, which may have a different crystallographic surface orientation compared to a bottom face of the cavities 103. In conventional process techniques, the process parameters of the selective epitaxial growth process are selected such that preferably a pronounced bottom-to-top fill behavior is obtained, wherein the bottom face acts as a template surface providing an increased deposition rate compared to the lateral growth rate achieved on the sidewalls of the cavities 103. In this manner, the strain-inducing material 104A may be formed so as to extend to substantially the same height throughout the entire cavity 103 and subsequently the material 104B having the reduced germanium contents may be formed so as to completely fill the respective cavity 103, wherein, if desired, an additional extra amount of silicon/germanium material of reduced germanium concentration may be formed. During the epitaxial growth of the material 104, a dopant species may be incorporated, if considered appropriate for obtaining the desired lateral and vertical profile of the drain and source regions 152. Furthermore, if required, additional dopant may be incorporated on the basis of appropriate implantation processes in order to establish the complex dopant profile. Thereafter, the spacer structure 165 may be completed and further implantation processes may be employed, if required, for incorporating further dopant species in accordance with the overall device requirements. Next, high temperature processes may be carried out in order to activate dopants and reduce implantation-induced lattice damage.

Consequently, the above described strain-inducing mechanism based on the graded strain-inducing semiconductor material 104 including the material 104A having an increased germanium concentration and the material 104B having the reduced germanium concentration is efficient so as to compensate, or even overcompensate, for any negative effect of a high-k dielectric material on the charge carrier mobility in the channel region 151, while, in other cases, performance of transistors comprising a conventional gate electrode structure may be significantly enhanced. On the other hand, upon further reducing the overall device dimensions, it turns out that increasingly a performance gain is observed that is less than expected, which is especially true in the case of sophisticated gate electrode structures, which comprise a high-k dielectric material. However, also when applying a substantially conventional approach for forming sophisticated gate electrode structures, the resulting gain in performance is less pronounced than is typically expected, thereby rendering this process strategy less attractive for future device generations requiring transistors having a critical gate length of 40 nm and less.

In view of the situation described above, the present disclosure relates to manufacturing techniques and semiconductor devices in which sophisticated transistors may be formed on the basis of an embedded strain-inducing semiconductor material, while avoiding or at least reducing the effects of one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure provides semiconductor devices and manufacturing techniques in which an embedded strain-inducing semiconductor material, such as a silicon/germanium alloy, silicon/carbon mixture and the like, may be formed with an appropriately graded or varying concentration profile. To this end, it has been recognized that a transition area formed by a strain-inducing semiconductor material and an adjacent channel region may have a significant influence on the overall transistor performance. In particular, when using a graded profile in the strain-inducing semiconductor material, for instance in order to provide appropriate surface characteristics of the strain-inducing semiconductor material in view of the further processing, a smoothly varying amount of the highly strained semiconductor material along a relatively steep sidewall of the initial cavity may result in increased overall strain and thus superior transistor performance. In this manner, the highly strained semiconductor material may be provided up to a desired height along the sidewalls of the cavity, while still avoiding undue lattice faults, such as dislocations and the like, due to the degraded transition between the channel region and the strain-inducing semiconductor material. On the other hand, a desired reduced concentration of a strain-inducing atomic species may be achieved at the surface of the drain and source regions.

On illustrative method disclosed herein includes forming a first cavity in an active region of a semiconductor device, wherein the first cavity is located laterally adjacent to a gate electrode structure of a transistor and has first sidewall faces and a bottom face formed from a semiconductor base material of the active region. The method further includes forming a second cavity of reduced size by forming a first strain-inducing semiconductor material in the first cavity so as to cover the bottom face and the first sidewall faces, wherein the second cavity of reduced size has second sidewall faces formed of the first strain-inducing semiconductor material and having a slope that is less than a slope of the first sidewall faces of the first cavity formed from the semiconductor base material. Furthermore, the method includes forming a second strain-inducing semiconductor material in the second cavity of reduced size so as to fill the second cavity of reduced size with a strain-inducing material, wherein the second strain-inducing semiconductor material differs in at least one material parameter from the first strain-inducing semiconductor material. Additionally the method includes forming drain and source regions at least in a portion of the first and second strain-inducing semiconductor materials.

A further illustrative method disclosed herein includes forming a gate electrode structure above a crystalline semiconductor base material of an active region of a semiconductor device. The method additionally includes forming a cavity in the active region in the presence of the gate electrode structure. Furthermore, the method includes forming a first crystalline semiconductor material on exposed surface areas of the cavity with a lateral growth rate varying from bottom to top of sidewalls of the cavity so as to be lowest at the top of the cavity, wherein the first crystalline semiconductor material has a first lattice mismatch with respect to the semiconductor base material. Moreover, the method includes forming a second crystalline semiconductor material above the first crystalline semiconductor material, wherein the second crystalline semiconductor material has a second lattice mismatch with respect to the semiconductor base material and wherein the second lattice mismatch is less than the first lattice mismatch.

One illustrative semiconductor device disclosed herein includes a drain region and a source region formed in an active region of a transistor. The semiconductor device further includes a channel region provided laterally between the drain region and the source region, wherein the channel region comprises a semiconductor base material. Moreover, the semiconductor device includes a gate electrode structure formed on the channel region. Additionally, the semiconductor device includes a first strain-inducing semiconductor material formed in the active region and forming a first side interface with the semiconductor base material. Additionally, the semiconductor device includes a second strain-inducing semiconductor material formed in the active region so as to be in contact to the first strain-inducing semiconductor material and forming a second side interface with the first strain-inducing semiconductor material, wherein a slope of the second side interface is less than a slope of the first side interface.

BRIEF DESCRIPTION OF THE DRAWINGS

The disclosure may be understood by reference to the following description taken in conjunction with the accompanying drawings, in which like reference numerals identify like elements, and in which.

Figure 1:
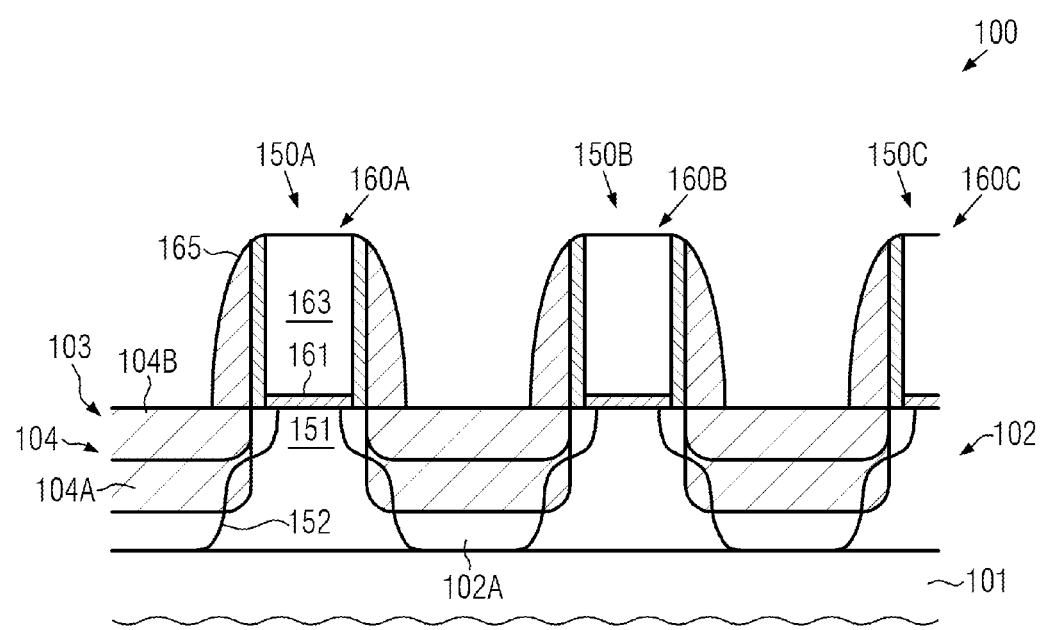
FIG. 1 schematically illustrates a cross-sectional view of a semiconductor device including a graded strain-inducing semiconductor material formed on the basis of conventional process strategies.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

The present disclosure provides semiconductor devices and manufacturing techniques in which an embedded strain-inducing semiconductor material, such as a silicon/germanium alloy, a silicon/carbon alloy and the like, may be provided with a graded concentration profile of a strain-inducing atomic species, i.e., an atomic species having a different covalent radius compared to the atomic species of the semiconductor base material of a corresponding active region, by implementing the strain-inducing semiconductor material having the high concentration of the strain-inducing atomic species in such a manner that a smooth transition of the material amount of the highly strained semiconductor material with respect to the adjacent channel region is obtained. That is, although a highly strained semiconductor material is formed along the interface between the highly strained semiconductor material and the channel region, the amount of the highly strained semiconductor material is significantly less at an upper portion of the active region compared to the lower lying region. This may be accomplished by providing the portion of the strain-inducing material having the reduced concentration of strain-inducing atomic species such that an interface between the strain-inducing materials of different concentration has a reduced slope compared to the interface formed by the highly strained semiconductor material and the channel region. Consequently, a substantially wedge-shaped portion of the highly strained semiconductor material may be provided between the strain-inducing semiconductor material of reduced strain and the channel region along a depth direction, thereby providing superior overall strain conditions and reducing lattice defects, which may conventionally contribute to a significant relaxation of the resulting strain.

In this manner, performance of transistors having reduced gate length in the range of 40 nm and significantly less may be enhanced on the basis of well-established strain-inducing mechanisms by appropriately adapting process parameters of the selective epitaxial growth process in order to form the graded strain-inducing semiconductor material so as to comply with the above-described geometric configuration. To this end, well-established selective epitaxial growth techniques may be applied, in which, in particular, the lateral growth rate may be appropriately varied upon forming a first portion of the strain-inducing semiconductor material in order to achieve a desired varying coverage of sidewall areas of the cavity formed in the active region. It is well known that the deposition rate in a selective epitaxial growth process may be controlled on the basis of a plurality of process parameters, such as temperature, pressure, gas flow rates of precursor materials, gas flow rates of reactive gases, which may result in a certain etch activity during the deposition process and the like. For example, in this manner, a crystallographically anisotropic deposition behavior may be achieved, in which the deposition rate strongly depends on the crystal plane, which is in contact with the deposition atmosphere. For example, by appropriately adjusting one or more of the above-identified process parameters, the deposition of a semiconductor material on a specific crystal plane may be effectively suppressed or reduced, thereby providing a high degree of flexibility in adjusting the degree of conformal ability achieved in the cavity having a bottom face and relatively steep sidewall faces. Consequently, by determining appropriate process parameters, the slope of sidewall areas upon depositing a strain-inducing semiconductor material in an initial cavity of well-defined geometry may be adjusted with a high degree of accuracy, thereby enabling a desired smooth transition of a highly strained semiconductor material that connect to a neighboring semiconductor base material in the channel region of the transistor.

In this respect, a strain-inducing semiconductor material is to be understood as a semiconductor material which may generally have any natural lattice constant that differs from the natural lattice constant of a semiconductor base material of the active region under consideration. A graded strain-inducing semiconductor material is to be understood as a material in which the lattice mismatch in one portion of the semiconductor material differs from the lattice mismatch in a neighboring portion, which is typically accomplished by varying the concentration of one atomic species having an increased or reduced covalent radius compared to the covalent radius of the dominant atomic species of the semiconductor base material.

With reference to FIGS. 2a-2g, further illustrative embodiments will now be described in more detail, wherein reference may also be made to FIG. 1 and the corresponding description, if required.

Figure 2A:
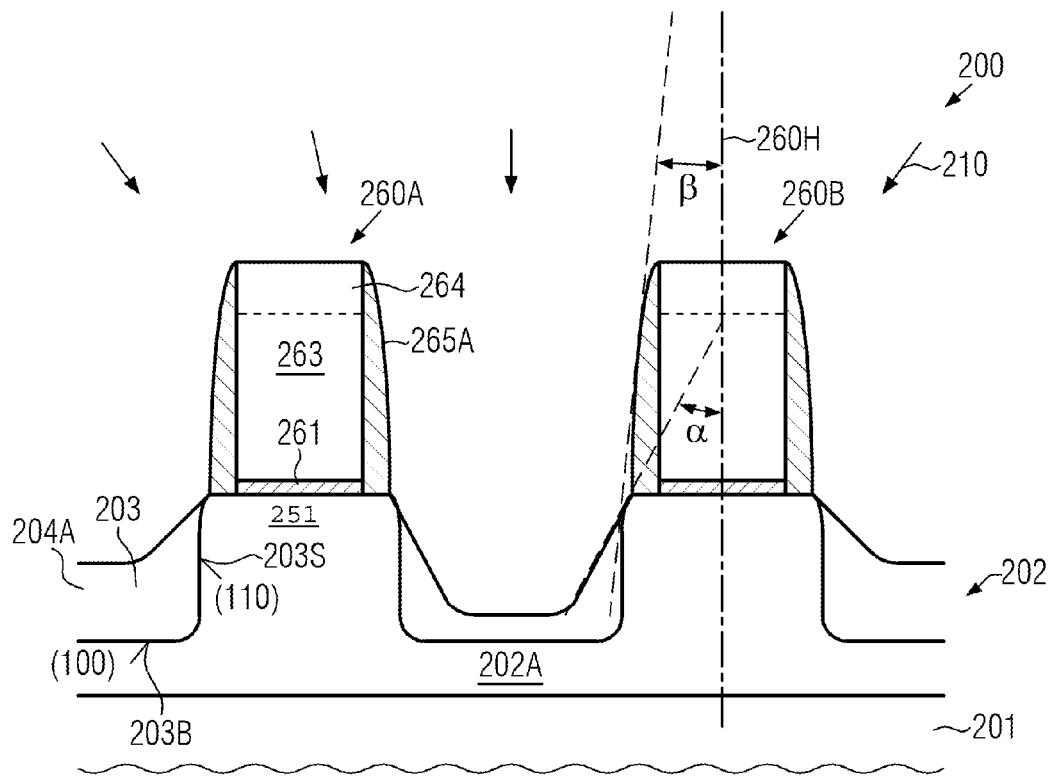
FIGS. 2a-2e schematically illustrate cross-sectional views of a semiconductor device during various manufacturing stages when an embedded strain-inducing semiconductor material may be formed on the basis of a smooth angle with respect to the channel region, according to illustrative embodiments.

FIG. 2a schematically illustrates a cross-sectional view of a semiconductor device 200 comprising a substrate 201, such as a semiconductor material and the like, above which may be formed a semiconductor layer 202, such as a silicon material, a silicon/germanium material and the like, which is also referred to herein as a semiconductor base material. It should be appreciated that the semiconductor layer 202 may directly connect to a crystalline semiconductor material of the substrate 201, thereby forming a bulk configuration. In other cases, a buried insulating layer (not shown) may be formed below the semiconductor layer 202, thereby providing a semiconductor- or silicon-on-insulator (SOI) architecture. The semiconductor layer 202 may comprise a plurality of active regions, which are generally to be understood as semiconductor regions in and above which one or more transistors are to be formed. For convenience, a single active region 202A is illustrated, which may be laterally delineated by appropriate isolation structures (not shown). Thus, the active region 202A comprises the semiconductor base material 202 having any appropriate configuration, wherein, in some illustrative embodiments, the base material 202 may be a silicon material which may contain a certain degree of dopant species and the like. In this case, the concentration of a silicon species may be 99 atomic percent or higher while, in other illustrative embodiments, a different silicon concentration may be used if considered appropriate for the characteristics of transistors to be formed in and above the active region 202A. Furthermore, gate electrode structures 260A, 260B may be formed on respective portions of the active region 202A and may have any appropriate configuration, for instance comprising a gate dielectric layer 261, an electrode material 263, such as amorphous silicon, polycrystalline silicon and the like, in combination with a cap layer or cap layer system 264. Furthermore, a spacer 265A may be provided so as to protect any sensitive gate materials and define a desired lateral offset of cavities 203 with respect to a channel region 251.

The semiconductor device 200 as illustrated in FIG. 2a may be formed on the basis of any appropriate process strategy, as is, for instance, also discussed above with respect to the semiconductor device 100. That is, after forming any isolation structures (not shown) and adjusting the basic characteristics of the active region 202A, the gate electrode structures 260A, 260B may be formed by providing the materials 261, 263, 264 and subsequently the resulting layer stack may be patterned, as described above. Thereafter, the spacer structure 265A may be formed, which, in some illustrative embodiments, may represent a "disposable" spacer element that may have to be removed in a later manufacturing stage. It should further be appreciated that other device areas may be covered by a mask layer when the formation of the cavities 203 and the strain-inducing semiconductor material is to be avoided in this manufacturing stage.

Thereafter, the cavities 203 may be formed by applying any appropriate etch technique, such as plasma enhanced etch recipes, wet chemical etch chemistries or any combination thereof, wherein, in the embodiment shown, the cavities 203 are provided as substantially box-shaped recesses having a bottom face 203B and a relatively steep sidewall faces 203S. Hence, the geometry of the cavities 203 has the relatively small slope, indicated by an angle β with respect to a height direction 260H, which may be considered as a normal with respect to any appropriate reference plane, such as the interface formed by the substrate 201 and the semiconductor base material 202. After preparing the device 200 for a selective epitaxial growth process, a first portion of the strain-inducing semiconductor material 204A may be formed on the basis of a first epitaxial growth step 210, in which appropriate process parameters are selected so as to obtain a desired vertical growth rate using the bottom face 203B as a growth plane, while also a certain lateral growth may be obtained on the sidewall faces 203S in order to obtain a varying thickness of the material 204A on the sidewall faces 203S. As previously discussed, the selective epitaxial growth process 210 may be performed on the basis of process parameters which may readily be determined by starting from conventional growth recipes and varying one or more process parameters, such as temperature, pressure and the like, in order to obtain a desired varying lateral growth rate resulting in a significantly increased angle α formed by the material 204A deposited on the sidewall faces 203S. Typically, the bottom face 203B may represent one type of crystal plane, such as a (100) plane, while the very steep sidewall faces 203S may represent another type of crystal plane, for example a (110) plane. Hence, this difference may be taken advantage of when forming the material 204A, wherein, contrary to the conventional approach, a significantly higher deposition rate on the sidewall faces 203S may be induced, however, with a highly non-conformal deposition behavior, in order to achieve the wedge-like geometry.

Figure 2B:
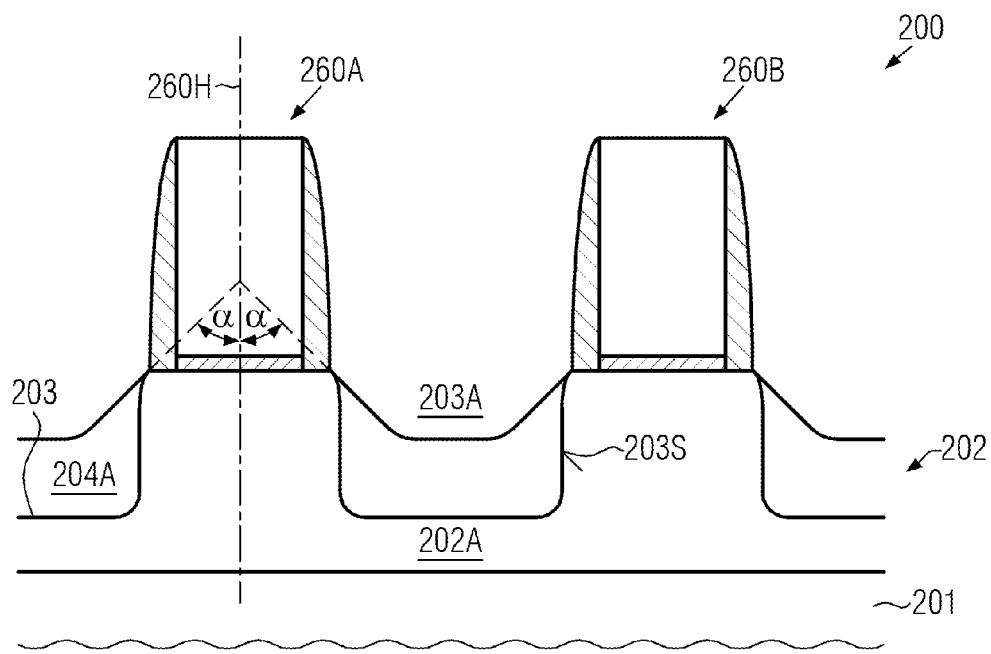

FIG. 2b schematically illustrates the device 200 in a further advanced manufacturing stage, i.e., after the formation of the strain-inducing semiconductor material 204A having a desired internal strain level. For example, the material 204A may be formed so as to obtain a desired high lattice mismatch with respect to the base material 202, as discussed above, for instance by providing a relatively high germanium concentration, the silicon/germanium mixture is to be provided in order to create a compressive strain. In other cases, any other appropriate atomic species, such as tin, may be used for obtaining a compressive strain, wherein an appropriate concentration is readily adjusted during the deposition process by adjusting the precursor gas flow rates, as discussed above. In other cases, if a tensile strain is to be induced in the active region 202A, carbon or phosphorous may be incorporated, if the semiconductor base material 202 is substantially comprised of silicon. Hence, upon completing the selective epitaxial growth process 210 (FIG. 2a), a second cavity of reduced size, indicated as 203A, is formed by the material 204A, wherein sidewalls of the cavities 203A of reduced size have a significantly reduced slope compared to the initial sidewall faces 203S. Consequently, the angle α is significantly greater than the angle β, thereby forming a varying amount of the material 204A at the sidewall surface 203S, wherein the corresponding amount increases with increasing depth of the cavities 203.

Figure 2C:
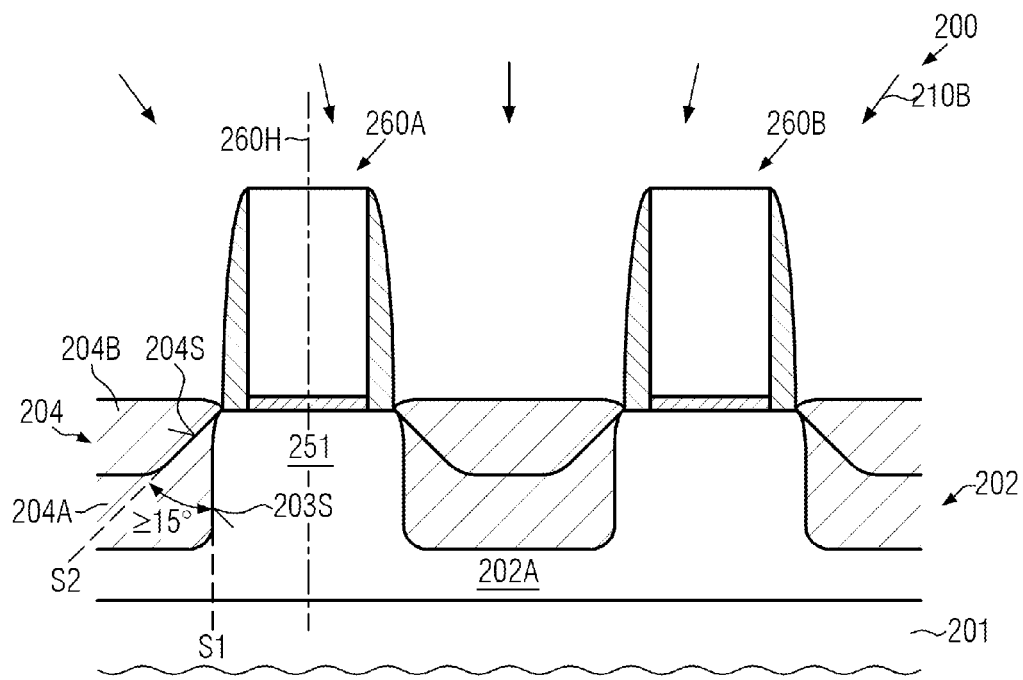

FIG. 2c schematically illustrates the device 200 in a further advanced manufacturing phase in which the device 200 is exposed to a further selective deposition atmosphere 210B in which at least a second portion of a strain-inducing semiconductor material, indicated by 204B, may be formed in the cavities 203A. To this end, the deposition process 210B may be performed on the basis of well-established selective epitaxial growth recipes in order to completely fill the initial cavities 203 or even overfill these cavities, as excess material is required for the further processing. As discussed above, the material composition 204B may differ from the material composition of the material 204A in order to obtain a generally graded strain-inducing semiconductor material, which may collectively be referred to as material 204. Hence, the lattice mismatch of the material 204B may differ from the lattice mismatch of the material 204A and is intended to induce a desired type of strain in the channel regions 251, to a lesser extent compared to the material 204A.

For example, when provided in the form of a silicon/germanium material, the material 204A may have a germanium concentration of 25-30 atomic percent or even higher, while the material 204B may have a germanium concentration of approximately 20 atomic percent or less. It should be appreciated, however, that these percentages represent examples only and any other material composition may be used in order to form the material 204 as a graded strain-inducing semiconductor material. For example, even a material having substantially no lattice mismatch with respect to the base material 202 may be provided as an upper portion of the material 204B. Furthermore, the materials 204A, 204B may be provided as materials of different composition, if considered appropriate. For example, the portion 204A may be provided in the form of a well-known silicon/germanium material, while the portion 204B may be provided as a silicon/tin material, in which a relatively low tin concentration may provide a certain degree of lattice mismatch, while, however, not unduly shifting other material characteristics compared to a relatively pure silicon base material. Similarly, the portion 204A may be provided on the basis of tin with a moderately high concentration of 5-15 atomic percent, if a compressive strain is to be induced in a silicon-based semiconductor material of the active region 202A.

Irrespective of the specific material composition of the portions 204A, 204B, the portion 204A may be provided with a moderately high slope with respect to the semiconductor base material, indicated as S1, which is defined by the interface between the material 204A and the base material of the active region 202A, wherein, for convenience, this interface is also indicated by reference sign 203S. On the other hand, an interface 204S formed by the portions 204B and 204A may have a significantly reduced slope, indicated as S2, thereby forming a wedge-like portion of the material 204A that laterally connects to the channel region 251. In this manner, the amount of highly strained material 204A provided at the interface 203S smoothly increases in the depth direction and thus provides an efficient strain transfer into the channel region 251, however, without unduly contributing to lattice defects.

Figure 2D:
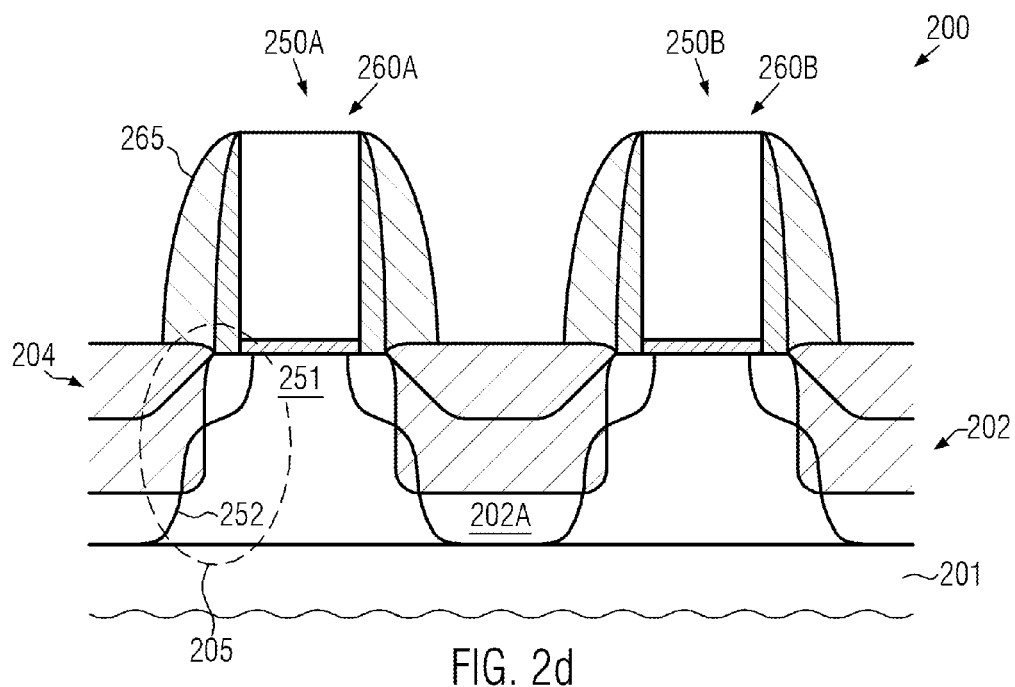

FIG. 2d schematically illustrates the device 200 in a further advanced manufacturing stage. As shown, the device 200 comprises a transistor 250A and a transistor 250B, which include the gate electrode structures 260A and 260B, respectively. In this manufacturing stage, the gate electrode structures 260A, 260B may comprise spacer structures 265 as required for forming appropriate drain and source regions 252 in the active region 202A. The transistors 250A, 250B may be formed on the basis of any appropriate process strategy, starting from the configuration as shown in FIG. 2c, as is, for instance, also discussed above with reference to the conventional device 100.

Consequently, in an area 205, a desired smooth transition of the strain-inducing effect from the material 204 into the channel region 251 may be achieved, while also any strain relaxing defects, such as dislocations and the like, may be significantly reduced due to the superior geometric configuration provided in the graded strain-inducing semiconductor material 204, as discussed above with reference to FIG. 2c.

Figure 2E:
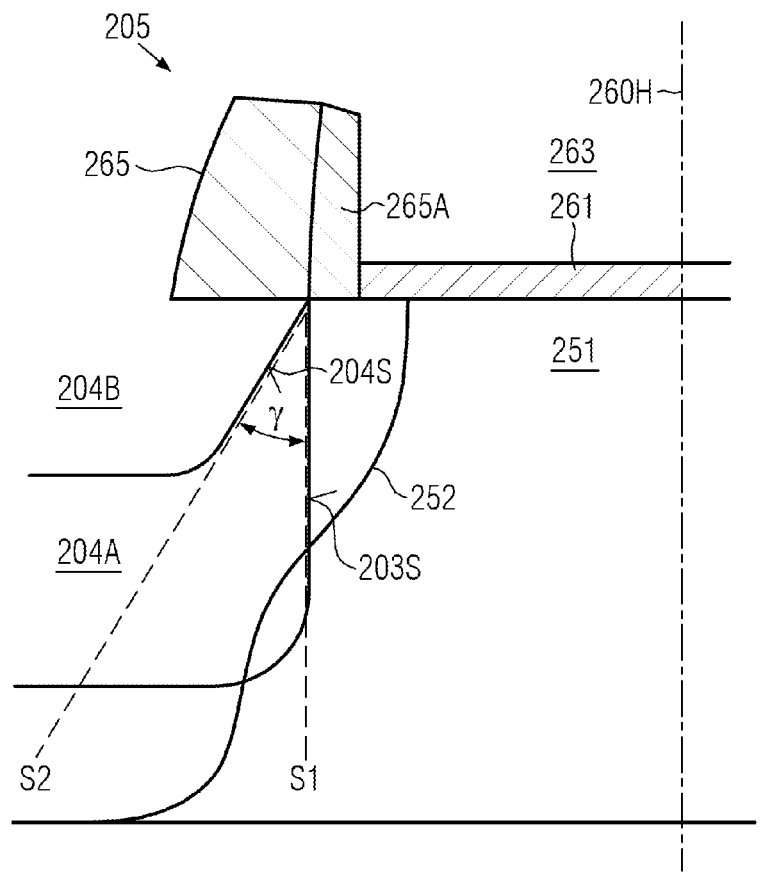

FIG. 2e schematically illustrates an enlarged view of the area 205 of FIG. 2d. As shown, the material 204A forms a wedge-like material portion at an upper area of the interface 203S order to provide superior strain transfer efficiency. To this end, the slope S2 is significantly less compared to the slope S1, as indicated by the angle γ, wherein it should be appreciated that the slopes S1 and S2 are to be taken with respect to the normal or height direction 260H. As already discussed above, in some illustrative embodiments, the angle γ is 15 degrees or greater.

Measurements performed on the basis of P-channel transistors having a configuration of the strain-inducing material as discussed above with reference to FIGS. 2a-2e seem to indicate that the resulting strain level in the channel region 251 is higher by several percent compared to a P-channel transistor formed on the basis of conventional strategies, as discussed above with reference to the device 100. Furthermore, due to the superior strain conditions, measurements also seem to indicate that overall performance of corresponding P-channel transistors is increased by approximately 2-5%, when considering drive current versus gate leakage current.

Figure 2F:
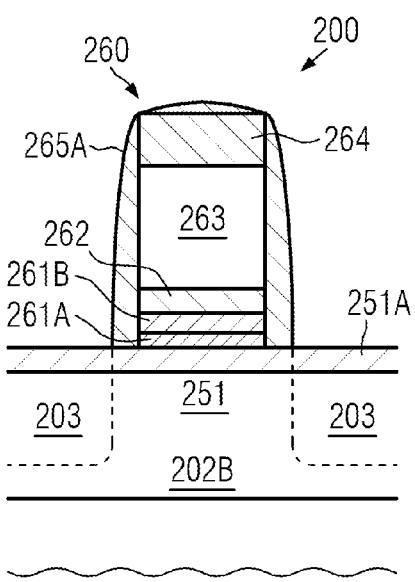
FIGS. 2f-2g schematically illustrate cross-sectional views of the semiconductor device during various manufacturing stages in which a threshold voltage adjusting semiconductor material is additionally provided in the active region, according to other illustrative embodiments.

FIG. 2f schematically illustrates a cross-sectional view of the device 200 in an embodiment in which a gate electrode structure 260 may be provided on an active region 202B on the basis of a high-k dielectric material. As discussed above, in this case, generally reduced charge carrier mobility may be observed in the channel region 251 due to the presence of the high-k dielectric material. Also in this case, the above-described principles may be applied so as to obtain superior device performance, since also in this case superior strain conditions may be achieved in the channel region 251.

As illustrated, typically the gate electrode structure 260 may comprise the high-k dielectric material 261B, possibly in combination with a conventional silicon oxide-based dielectric material 261A, wherein these materials may be covered by a metal-containing electrode material 262, such as titanium nitride and the like, wherein a work function adjusting metal species, such as aluminum, may also be incorporated in the layer 262 and/or in the layer 261B. Furthermore, the spacer 265A may be provided so as to reliably laterally enclose the sensitive gate materials 261A, 261B and 262.

Furthermore, frequently, an additional semiconductor material 251A may have to be provided in the channel region 251 in order to establish a desired band gap offset as is required for implementing appropriate threshold voltages for different types of transistors. For example, frequently, the material 251A may be provided in P-channel transistors in the form of a silicon/germanium alloy with a germanium concentration of 20-30 atomic percent.

The device 200 may be formed on the basis of well-established process techniques, wherein, prior to forming the gate electrode structure 260, the material 251A may be formed selectively in the active region 202B, which may be accomplished on the basis of well-established selective epitaxial growth techniques. Thereafter, the gate electrode structure 260 may be formed, wherein additional deposition and patterning steps may have to be implemented in order to provide the materials 261A, 261B and 262. Thereafter, the cavities 203 may be formed on the basis of etch strategies, as already discussed above.

Figure 2G:
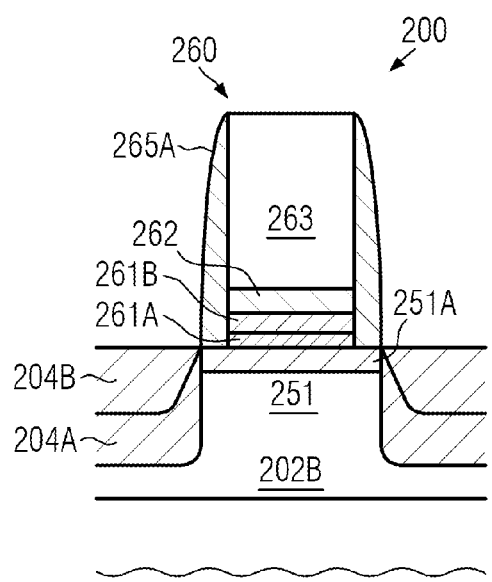

FIG. 2g schematically illustrates a cross-sectional view of the device 200 in a further advanced manufacturing stage, in which the strain-inducing materials 204A, 204B may be provided in a geometric configuration, as already discussed above, which may be accomplished by using the above-described process strategies. Consequently, the material 204A providing the desired high strain in the channel region 251, which comprises the threshold voltage adjusting semiconductor material 251A, may smoothly connect to the channel region 251, as discussed above. It should be appreciated that the material 251A, which basically has a different material composition compared to the semiconductor base material of the active region 202B, may also have a significant influence on the strain conditions due to a certain lattice mismatch and the corresponding lattice defects, which are typically associated with the presence of the material 251A in the channel region 251. In particular, corresponding lattice defects may occur when materials of different lattice mismatch may have to be provided within a small area, as is the case when providing a graded strain-inducing semiconductor material in combination with the threshold voltage adjusting material 251A. For example, due to the corresponding lattice defects, frequently, a reduced etch resistivity of the semiconductor material in the channel region 251 during a wet chemical etch and cleaning process may be observed in conventional sophisticated transistors having the benefit of the threshold voltage adjusting material 251A in combination with a graded strain-inducing semiconductor material as shown in the device 100.

By using the material 204A having the wedge-like portion connecting to the channel region 251 and thus also connecting to the threshold voltage adjusting semiconductor material 251A, the defect rate in the channel region 251 may be significantly reduced compared to conventional device configurations. For example, when provided in the form of a silicon/germanium alloy, the material 204A may have a similar germanium concentration as the material 251A, thereby additionally contributing to superior strain conditions and reduced lattice defects. Furthermore, the signals transfer of strain into the channel region 251 may also be achieved for the device configuration of the device 200 comprising the gate electrode structure 260 on the basis of the high-k dielectric material 261B and the threshold voltage adjusting semiconductor material 251A.

As a result, the present disclosure provides manufacturing techniques and semiconductor devices in which an efficient strain-inducing mechanism is implemented on the basis of an embedded strain-inducing semiconductor material having at least two different areas of strain-inducing effect, which is referred to herein as a graded strain-inducing semiconductor material. Contrary to conventional approaches, the material portion having reduced lattice mismatch with respect to the semiconductor base material may be provided with a lateral side phase that has a reduced slope compared to the lateral side phase of the portion heading the increased lattice mismatch. In this manner, a wedge-like strain-inducing material provides a small strain transfer into the adjacent channel region without unduly contributing to lattice defects. The superior architecture of the graded strain-inducing semiconductor material may be obtained on the basis of selective epitaxial growth processes by appropriately adjusting process parameters without contributing to additional process complexity compared to well-established conventional process strategies.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method, comprising:

forming a threshold voltage adjusting material on a crystalline semiconductor base material of an active region of a semiconductor device;

forming a first cavity in said active region of said semiconductor device, said first cavity being located laterally adjacent to a gate electrode structure of a transistor on said threshold voltage adjusting material, said first cavity having first sidewall faces and a bottom face formed from a semiconductor base material of said active region;

forming a second cavity of reduced size by forming a first strain-inducing semiconductor material comprising a first lattice mismatch with respect to said semiconductor base material in said first cavity so as to cover said bottom face and said first sidewall faces, said second cavity of reduced size being formed above said first strain-inducing semiconductor material and having second sidewall faces formed of said first strain-inducing semiconductor material and having a slope that is less than a slope of said first sidewall faces of said first cavity formed from said semiconductor base material;

forming a second strain inducing semiconductor material comprising a second lattice mismatch with respect to said semiconductor base material that is less than said first lattice mismatch in said second cavity of reduced size above said first strain inducing semiconductor material so as to fill said second cavity of reduced size with a strain-inducing material, wherein a portion of said first strain-inducing semiconductor material laterally contacts said threshold voltage adjusting material and is positioned between said second strain inducing semiconductor material and said threshold voltage adjusting material; and forming drain and source regions at least in a portion of said first and second strain-inducing semiconductor materials.

2. The method of claim 1, wherein said first strain-inducing semiconductor material comprises germanium with a concentration of 25 atomic percent or higher.

3. The method of claim 2, wherein said second strain-inducing semiconductor material comprises germanium with a concentration of 20 atomic percent or less.

4. The method of claim 1, wherein forming said first strain-inducing semiconductor material comprises performing a first epitaxial growth step based on a process parameter set selected so as to initiate material growth on said first sidewall faces and said bottom face.

5. The method of claim 4, wherein forming said second strain-inducing semiconductor material comprises performing a second epitaxial growth step by changing a value of at least one parameter of said process parameter set that influences a material composition of said second strain-inducing semiconductor material.

6. The method of claim 1, further comprising forming said threshold voltage adjusting semiconductor material on said semiconductor base material prior to forming said cavity.

7. The method of claim 6, wherein said threshold voltage adjusting semiconductor material comprises germanium with a concentration of 20 atomic percent or higher.

8. A method, comprising:
    forming a threshold voltage adjusting material on a crystalline semiconductor base material of an active region of a semiconductor device;
    forming a gate electrode structure above said threshold voltage adjusting material;
    forming a cavity in said active region in the presence of said gate electrode structure;
    forming a first crystalline semiconductor material on exposed surface areas of said cavity with a lateral growth rate varying from bottom to top of sidewalls of said cavity so as to be lowest at the top of said cavity, said first crystalline semiconductor material having a first lattice mismatch with respect to said semiconductor base material; and
    forming a second crystalline semiconductor material above said first crystalline semiconductor material, said second crystalline semiconductor material having a second lattice mismatch with respect to said semiconductor base material, said second lattice mismatch being less than said first lattice mismatch, wherein a portion of said first strain-inducing semiconductor material laterally contacts said threshold voltage adjusting material and is positioned between said second strain inducing semiconductor material and said threshold voltage adjusting material.

9. The method of claim 8, further comprising determining at least one process parameter of a selective epitaxial growth process that substantially influences said varying lateral growth rate and using said at least one determined process parameter to adjust a sidewall slope of said first crystalline semiconductor material.

10. The method of claim 8, wherein forming said cavity comprises forming sidewalls of said cavity so as to have a slope of 5 degrees or less at least in a central area with respect to a height direction of said gate electrode structure.

11. The method of claim 8, wherein forming said first and second crystalline semiconductor materials comprises forming a material so as to induce compressive strain in a channel region of said active region.

12. The method of claim 8, wherein forming said first and second crystalline semiconductor materials comprises forming a material so as to induce tensile strain in a channel region of said active region.

13. The method of claim 11, wherein said first and second crystalline semiconductor materials are formed so as to comprise at least one of germanium and tin.

14. The method of claim 12, wherein said first and second crystalline semiconductor materials are formed so as to comprise at least one of carbon and phosphorous.

15. The method of claim 8, further comprising forming said threshold voltage adjusting semiconductor material on said semiconductor base material prior to forming said gate electrode structure.

16. A semiconductor device, comprising:
    a drain region and a source region formed in an active region of a transistor;
    a channel region provided laterally between said drain region and said source region, said channel region comprising a threshold voltage adjusting material above a semiconductor base material;
    a gate electrode structure formed on said channel region;
    a first strain-inducing semiconductor material formed in said active region, said first strain-inducing semiconductor material comprising a first lattice mismatch with respect to said semiconductor base material forming a first side interface with said semiconductor base material; and
    a second strain-inducing semiconductor material comprising a second lattice mismatch with respect to said semiconductor base material that is less than said first lattice mismatch formed in said active region so as to be in contact with said first strain-inducing semiconductor material and forming a second side interface with said first strain-inducing semiconductor material, a slope of said second side interface being less than a slope of said first side interface, wherein a portion of said first strain-inducing semiconductor material laterally contacts said threshold voltage adjusting material and is positioned between said second strain inducing semiconductor material and said threshold voltage adjusting material.

17. The semiconductor device of claim 16, wherein an angle difference between the slope of said first side interface and the slope of said second side interface is 15 degrees or more.

18. The method of claim 1 wherein said first strain-inducing semiconductor material comprises a first concentration of an element selected from the group consisting of germanium and tin and said second strain-inducing semiconductor material comprises a second concentration of said element selected from the group consisting of germanium and tin that is less than the first concentration.

19. The method of claim 1 wherein:
    said first strain inducing semiconductor material comprises a first concentration of germanium of 25 atomic percent or higher; and,
    said second strain inducing semiconductor material comprises a second concentration of germanium of 20 atomic percent or less.

20. The method of claim 7 wherein said first strain-inducing semiconductor material comprises germanium at a concentration of 25 atomic percent or higher and said second strain-inducing semiconductor material comprises germanium at a concentration of 20 atomic percent or higher.

21. The method of claim 13 wherein:
    the element is germanium;
    said first concentration is 25 atomic percent or higher; and,
    said second concentration is 20 atomic percent or less.

22. The method of claim 8 further comprises:
forming said threshold voltage adjusting semiconductor material on said semiconductor base material prior to forming said gate electrode structure;
wherein:
  said first strain-inducing semiconductor material comprises germanium at a concentration of 25 atomic percent or higher;
  said second strain-inducing semiconductor material comprises germanium at a concentration of 20 atomic percent or higher, and,
  said threshold voltage adjusting semiconductor material comprises germanium with a concentration of 20 atomic percent or higher.

23. The semiconductor device of claim 16 wherein:
the element is germanium;
said first concentration is 25 atomic percent or higher; and,
said second concentration is 20 atomic percent or less.

24. The semiconductor device of claim 16 wherein: said first strain-inducing semiconductor material comprises germanium at a concentration of 25 atomic percent or higher; said second strain-inducing semiconductor material comprises germanium at a concentration of 20 atomic percent or higher; and, said threshold voltage adjusting semiconductor material comprises germanium with a concentration of 20 atomic percent or higher.

* * * * *